(12) United States Patent
Sakaki

(10) Patent No.: US 7,002,812 B2
(45) Date of Patent: Feb. 21, 2006

(54) ELECTRONIC MODULE AND METHOD FOR FABRICATING THE SAME

(75) Inventor: Yoichiro Sakaki, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 309 days.

(21) Appl. No.: 10/669,688

(22) Filed: Sep. 25, 2003

(65) Prior Publication Data

US 2004/0092137 A1    May 13, 2004

(30) Foreign Application Priority Data

Oct. 28, 2002    (JP)    .............................. 2002-312238

(51) Int. Cl.
*H05K 7/06*    (2006.01)
*G02F 1/1345*    (2006.01)

(52) U.S. Cl. ...................... 361/803; 349/149; 349/150; 349/151

(58) Field of Classification Search .......... 349/149–152
See application file for complete search history.

(56) References Cited

U.S. PATENT DOCUMENTS

| | | | |
|---|---|---|---|
| 5,402,255 A | | 3/1995 | Nakanishi et al. |
| 5,592,199 A | | 1/1997 | Kawaguchi et al. |
| 5,670,994 A | | 9/1997 | Kawaguchi et al. |
| 5,737,053 A | * | 4/1998 | Yomogihara et al. ........ 349/149 |
| 6,424,400 B1 | * | 7/2002 | Kawasaki .................... 349/149 |
| 6,437,764 B1 | * | 8/2002 | Suzuki et al. ................. 345/87 |
| 6,519,020 B1 | * | 2/2003 | Cha et al. .................... 349/150 |
| 6,864,941 B1 | * | 3/2005 | Yano ........................... 349/149 |

FOREIGN PATENT DOCUMENTS

| | | | |
|---|---|---|---|
| JP | 01235922 A | * | 9/1989 |
| JP | 04218933 A | * | 8/1992 |
| JP | 5-20034 U | | 3/1993 |
| JP | 6-3684 A | | 1/1994 |
| JP | 7-49657 A | | 2/1995 |
| JP | 10-319876 A | | 4/1998 |
| JP | 2000-137445 A | | 5/2000 |

OTHER PUBLICATIONS

U.S. Appl. No. 09/688,684 filed on Oct. 17, 2000, currently pending; for: "Liquid Crystal Display Device"; Applicants: Katsunori Nagata et al.
U.S. Appl. No. 10/652,166 filed on Sep. 2, 2003, currently pending; for: "Electronic Module and Driving Circuit Board Therefor"; Applicant: Yoichiro Sakaiki.

\* cited by examiner

*Primary Examiner*—John B. Vigushin
(74) *Attorney, Agent, or Firm*—Keating & Bennett,LLP

(57) ABSTRACT

An electronic module includes an electronic circuit board having circuit elements, signal lines connected to the circuit elements, and board terminals disposed on a terminal region, and an input board and driver circuit boards mounted on the terminal region of the electronic circuit board. Each of the driver circuit boards has input terminals and output terminals. The output terminals are electrically connected to the signal lines of the electronic circuit board. The input board has main wiring lines for transmitting signals input externally, and branch wiring lines branched from the main wiring lines. The branch wiring lines are electrically connected to the input terminals of the driver circuit boards via the board terminals of the electronic circuit board.

18 Claims, 10 Drawing Sheets

$A1 < A3 < A2$
$\begin{bmatrix} B1 < B3 < B2 \\ C1 < C3 < C2 \end{bmatrix}$

ELECTRONIC MODULE AND METHOD FOR FABRICATING THE SAME

BACKGROUND OF THE INVENTION

1. Field of the Invention

The present invention relates to an electronic module and a method for manufacturing the same.

2. Description of the Related Art

Currently, in liquid crystal display units and the like, a tape carrier package (TCP) method and a chip on glass (COG) method are mainly used for connection between a display panel and a driver for driving the display panel.

FIG. 1A is a diagrammatic view showing a structure of a conventional TCP type liquid crystal module, and FIG. 1B is a cross-sectional view taken along line A–A' in FIG. 1A. In this liquid crystal module, as shown in FIG. 1B, a plurality of gate TCPs (driver circuit boards) 12 and source TCPs 14 are connected to a gate terminal region and a source terminal region of a display panel 1, respectively, via corresponding anisotropic conductive films (ACFs) 17. The gate TCPs 12 and the source TCPs 14 are also connected to a gate printed wiring board (PWB) 13 and a source PWB 15, respectively, via corresponding ACFs 17. The gate PWB 13 and the source PWB 15 are soldered to corresponding flexible printed circuits (FPCs) 16 that are connected to an external circuit board. In the TCP type liquid crystal module described above, signals and the power supply voltage (hereinafter, these are sometimes collectively called "signals" for simplification) are directly supplied to all of the gate TCPs 12 and all of the source TCPs 14 from the gate PWB 13 and the source PWB 15, respectively.

A substrate-free type liquid crystal module that eliminates the need for the PWBs provided for the TCP type liquid crystal module described above has been proposed.

For example, Japanese Laid-Open Patent Publication No. 2001-188246 (Literature 1, FIG. 9) discloses a substrate-free structure, in which, as shown in FIG. 2, panel wiring lines 18 and 19 run on a gate terminal region and a source terminal region of a display panel 11, respectively. A signal input via a FPC 16 is transferred to a plurality of gate TCPs 12 or source TCPs 14 sequentially from one TCP to its adjacent TCP via the panel wiring line 18 or 19.

FIG. 3A is a diagrammatic view showing a structure of a COG type liquid crystal module, and FIG. 3B is a cross-sectional view taken along line A–A' in FIG. 3A.

As shown in FIG. 3A, in the COG type liquid crystal module, a plurality of source driver ICs 24 (hereinafter, a driver IC is simply called an IC) and a source FPC are mounted on a source terminal region of a display panel 11. Likewise, a plurality of gate ICs 22 and a gate FPC 23 are mounted on a gate terminal region of the display panel 11. As shown in FIG. 3B, the gate ICs 22 and the source ICs 24 are connected to the display panel 11 via corresponding ACFs 17, and also the gate FPC 23 and the source FPC 25 are connected to the display panel 11 via corresponding ACFs 17.

COG type liquid crystal modules have a problem in that the frame width (width of the terminal region) of the display panel 11 is large compared with TCP type liquid crystal modules. A liquid crystal module for solving this problem is disclosed in Japanese Laid-Open Patent Publication No. 2000-137445 (Literature 2, FIG. 1), for example. FIG. 4 is a partial diagrammatic view of a liquid crystal module disclosed in Literature 2. This liquid crystal module includes a FPC 25 having a comb shape, which has portions protruding into spaces between adjacent source ICs 24. Each of the source ICs 24 is connected to the FPC 25 at both sides via terminals 29 on the display panel. Having this structure, the frame width of this liquid crystal module is smaller than that of the liquid crystal module shown in FIGS. 3A and 3B.

The conventional liquid crystal modules described above have the following problems. The TCP type liquid crystal module shown in FIGS. 1A and 1B has a long track record in mass production, but has a problem that the number of components is large and the manufacturing cost including materials cost and mounting machining cost is high. This liquid crystal module also has a shortcoming in that the module assembly work is complicated due to the large PWBs extending from the display panel 11.

On the contrary, the substrate-free liquid crystal module shown in FIG. 2 has a small number of components compared with the TCP type liquid crystal module described above, and thus, the manufacturing cost can be reduced. In this type of liquid crystal module, in which a signal is transferred to the plurality of TCPs from the input FPC 16, wiring impedance on the display panel 11 must be held to a low level. However, since the panel wiring lines 18 and 19 are normally formed by a thin film deposition process, the impedance thereof is considerably high compared with wiring lines formed on the TCPs. Therefore, if the adjacent TCPs are spaced farther apart from each other due to an increase in size of the display panel 11, thus the panel wiring lines 18 and 19 become longer, and as a result, the influence of the impedance on the display quality will be significant. Also, if the number of TCPs increases due to high definition of the display panel 11, the number of TCPs to which a signal is transferred from one FPC increases. In this case, also, the display quality will be adversely influenced. The number of FPCs used is generally determined depending on the size of the display panel. For example, two FPCs are provided for VGA class, three FPCs for XGA class, and four or more FPCs for UXGA class.

As described above, in the TCP type and substrate-free type liquid crystal modules, it is difficult to achieve both a reduction in manufacturing cost and high definition, particularly for large-size models.

The COG type shown in FIGS. 3A and 3B has a small number of components and thus can reduce the manufacturing cost, but has a problem in that the frame width of the display panel 11 is large. Increase of the frame width is critical when the liquid crystal module is applied to a notebook personal computer. Even when applied to a device that has comparatively few limitations on the frame width, such as a monitor and a TV set, an increase of the size of the display panel 11 is undesirable because this leads to a cost increase.

The COG type liquid crystal module shown in FIG. 4 has a smaller frame width than the COG type liquid crystal module shown in FIGS. 3A and 3B. However, the process of connecting the ICs 24 to the FPC 25 is complicated, and thus the mounting cost increases.

Moreover, in the COG type liquid crystal modules shown in FIGS. 3A and 3B and FIG. 4, the connection pitch of output terminals of the ICs 22 and 24 for outputting signals to the display panel 11 is narrow compared with that in the TCP type. Therefore, when the limitation (minimum value) of the signal line wiring pitch on the display panel 11 is the same, the run length of signal lines before reaching a display pixel region is larger and thus the distance between the ICs 22 and 24 and the display pixel region is longer, than in the TCP type. For this reason, also, the frame width increases.

SUMMARY OF THE INVENTION

In order to overcome the problems described above, preferred embodiments of the present invention provide an electronic module that has a very small frame width and that is applicable to all types of electronic equipment, and also provide a method for manufacturing an electronic module that requires no complicated manufacturing steps and has a very low manufacturing cost.

An electronic module according to a preferred embodiment of the present invention includes an electronic circuit board having a plurality of circuit elements, a plurality of signal lines connected to the plurality of circuit elements, and a plurality of board terminals disposed on a terminal region, and an input board, a first driver circuit board and a second driver circuit board mounted on the terminal region of the electronic circuit board, wherein each of the first and second driver circuit boards has a plurality of input terminals and a plurality of output terminals, the plurality of output terminals being electrically connected to the plurality of signal lines of the electronic circuit board, the input board has a plurality of main wiring lines for transmitting signals input externally, and a plurality of first branch wiring lines and a plurality of second branch wiring lines branched from the plurality of main wiring lines, and the plurality of first branch wiring lines and the plurality of second branch wiring lines are electrically connected to the plurality of input terminals of the first driver circuit board and the plurality of input terminals of the second driver circuit board, respectively, via the plurality of board terminals of the electronic circuit board.

Preferably, the terminal region includes an x terminal region arranged along an x direction of the electronic circuit board, and the first and second driver circuit boards are mounted on the x terminal region so as to be adjacent to each other in the x direction, the input board has a belt portion extending in the x direction and a plurality of protrusions extending in a y direction crossing the x direction from the belt portion, each of the first and second driver circuit boards is disposed between the two adjacent protrusions, and the plurality of first and second branch wiring lines run on the plurality of protrusions.

Preferably, the plurality of input terminals of each of the first and second driver circuit boards define first-side and second-side input terminal groups disposed on at least two regions spaced apart from each other in the x direction, and the plurality of first branch wiring lines and the plurality of second branch wiring lines individually define first-side and second-side branch wiring line groups branched from the main wiring lines in different regions spaced apart from each other in the x direction in correspondence with the first-side and second-side input terminal groups.

Preferably, the plurality of protrusions include a protrusion having the second-side branch wiring line group connected to the first driver circuit board and the first-side branch wiring line group connected to the second driver circuit board.

Preferably, each of the first and second driver circuit boards has first and second edges spaced apart from each other in the x direction, the plurality of input terminals of the first driver circuit board are located near the first edge of the first driver circuit board, and the plurality of input terminals of the second driver circuit board are located near the first edge of the second driver circuit board.

Preferably, the plurality of protrusions include first and second protrusions adjacent to each other in the x direction, the first protrusion has the first branch wiring line, and the second protrusion has the second branch wiring line.

Preferably, the first and second driver circuit boards and the belt portion of the input board partially overlap each other when viewed in a direction that is perpendicular to the electronic circuit board.

Preferably, the first and second protrusions of the input board, the first driver circuit board and the second driver circuit board are bent at one time to form a predetermined angle with respect to the electronic circuit board.

Preferably, the electronic module includes m (m≧3) driver circuit boards including the first and second driver circuit boards, the input board has m sets of a plurality of branch wiring lines including the plurality of first branch wiring lines and the plurality of second wiring lines respectively corresponding to the m driver circuit boards, the plurality of board terminals of the electronic circuit board include a plurality of board terminals for the input board respectively connected to the m sets of the plurality of branch wiring lines, the plurality of board terminals for the input board on the electronic circuit board form n (n≧3) board terminal groups including the first, second, . . . , k-th, (k+1)th, . . . , n-th groups, each of the n board terminal groups including a plurality of board terminals for input board arranged in an x direction at a predetermined pitch, and in at least two board terminal groups, a predetermined pitch $P_k$ in the k-th board terminal group and a predetermined pitch $P_{k+1}$ in the (k+1)th board terminal group have the relationship $P_k < P_{k+1}$.

Preferably, the electronic module further includes third and fourth driver circuit boards mounted on a y terminal region of the electronic circuit board arranged along a y direction crossing an x direction, each of the third and fourth driver circuit boards has a plurality of input terminals and a plurality of output terminals, the plurality of output terminals being electrically connected to the plurality of signal lines of the electronic circuit board, the plurality of input terminals receiving signals via the input board.

The input board may preferably be a FPC or other suitable structure.

The method for manufacturing the electronic module described above according to a preferred embodiment of the present invention includes the steps of forming an anisotropic conductive film on a predetermined region of a terminal region of an electronic circuit board, arranging the input board and the first and second driver circuit boards so as to partially overlap the predetermined region of the terminal region via the anisotropic conductive film, and bonding the input board and the first and second driver circuit boards to the anisotropic conductive film simultaneously to electrically connect the plurality of input terminals of the first and second driver circuit boards to the first and second branch wiring lines via the plurality of board terminals and electrically connect the plurality of output terminals of the first and second driver circuit boards to the plurality of signal lines.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Hereinafter, preferred embodiments of the present invention will be described with reference to the relevant drawings.

Figure 5A:
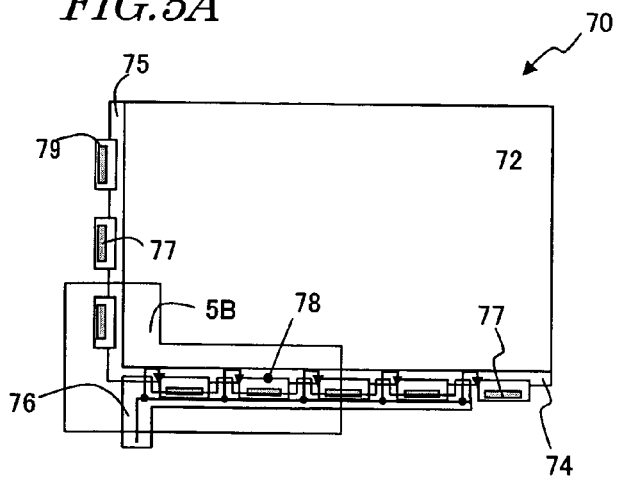
FIG. 5A is a plan view of an electronic module according to a preferred embodiment of the present invention.
Figure 5B:
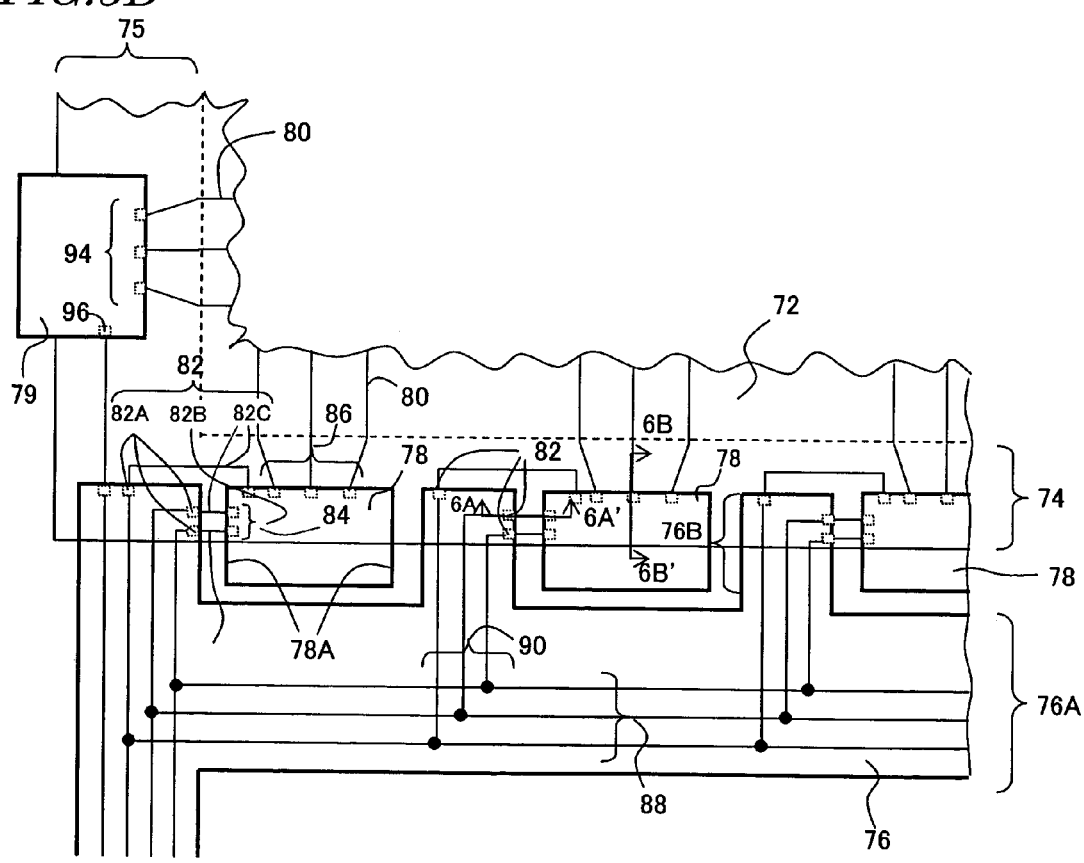
FIG. 5B is a partially enlarged view of region 5B in FIG. 5A.

FIG. 5A is a plan view of an electronic module 70 of a preferred embodiment of the present invention, and FIG. 5B is a partially enlarged view of region 5B in FIG. 5A.

As shown in FIGS. 5A and 5B, the electronic module 70 includes an electronic circuit board 72, and an input board 76 and a plurality of driver circuit boards 78 mounted on a terminal region 74 of the electronic circuit board 72. The electronic circuit board 72 includes circuit elements (not shown), signal lines 80 connected to the circuit elements, and board terminals 82 disposed on t h e terminal region 74. The driver circuit boards 78 include drive circuits 77 for supplying signals to the signal lines 80 of the electronic circuit board 72. The driver circuit boards 78 further include input terminals 84 and output terminals 86. The output terminals 86 are electrically connected to the signal lines 80 of the electronic circuit board 72. The input board 76, which is connected to an external circuit board, includes main wiring lines 88 for transmitting signals received from the external circuit board and branch wiring lines 90 branched from the main wiring lines 88. The branch wiring lines 90 are electrically connected to the input terminals 84 of the driver circuit boards 78 via the board terminals 82 of the electronic circuit board 72.

In the electronic module 70, signals input externally are supplied to the respective driver circuit boards 78 by way of the main wiring lines 88 and the branch wiring lines 90 of the input board 76, the board terminals 82 of the electronic circuit board 72, and the input terminals 84 of the driver circuit boards 78 in this order. That is, to transmit signals from the input board 76 to the driver circuit boards 78, no additional board is required between the input board 76 and the driver circuit boards 78. This reduces the number of components compared with the TCP type shown in FIG. 1. With the reduction of the number of components, the workability (assembly workability) in the manufacturing process improves, and the manufacturing cost (mounting cost) can be reduced.

Figure 2:
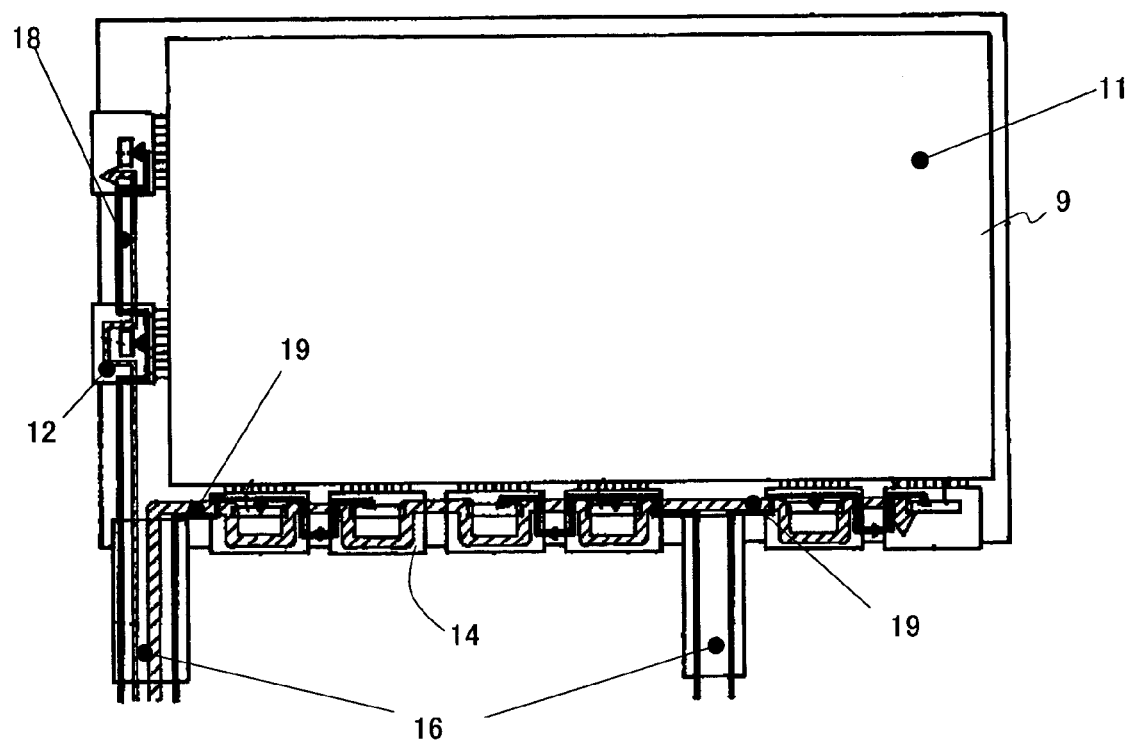
FIG. 2 is a diagrammatic view showing a structure of a conventional substrate-free type liquid crystal module.

Also, in the electronic module 70, signals input externally are transmitted through the main wiring lines 88 of the input board 76 and then supplied to the respective driver circuit boards 78 via the branch wiring lines 90, and are not transferred to the adjacent driver circuit boards sequentially via a wiring line disposed on the electronic circuit board as in the substrate-free type shown in FIG. 2. By this way of signal supply, the signals are prevented from degrading, and thus stable signals can be supplied to the respective driver circuit boards. Therefore, with the unique configuration of the electronic module 70 of this preferred embodiment, large-size, high-definition electronic equipment can be attained.

Moreover, in the electronic module 70, unlike the COG type, the driver circuit boards 78 are mounted on the electronic circuit board 72. Therefore, an increase in the frame width as in the COG type is prevented. Also, an increase in the cost of the electronic circuit board as in the COG type is prevented.

The terminal region 74 of the electronic circuit board 72 is arranged along an edge of the electronic circuit board 74 extending in the x direction, for example. In this case, the input board 76 and the plurality of driver circuit boards 78 are mounted on the terminal region 74 extending in the x direction, wherein the plurality of driver circuit boards 78 are arranged to be adjacent to each other along the x direction.

A chip on film (COF) is preferably used for each driver circuit board 78. Alternatively, a TCP may be used. In particular, a COF is suitable when the number of signals to be transmitted is large (40, for example). For the input board 76, a FPC is preferably used. These COF, TCP and FPC are bendable as will be described later. Therefore, by using these elements for the driver circuit boards 78 and the input board 76, an additional effect of attaining further reduction in module size is obtained.

Figure 6A:
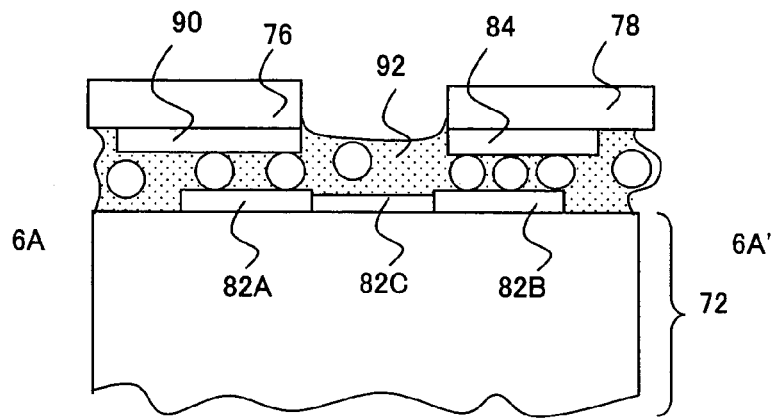
FIGS. 6A and 6B are cross-sectional views taken along line 6A–6A' and line 6B–6B' in FIG. 5B, respectively.
Figure 6B:
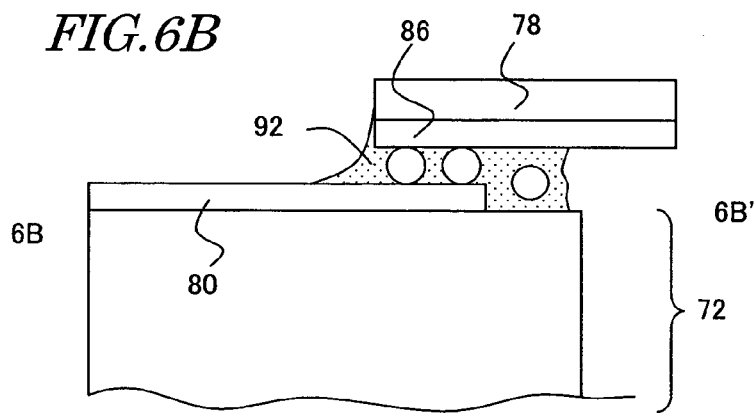

An anisotropic conductive film (ACF) 92 is preferably used for electrical connection between the driver circuit boards 78 and the electronic circuit board 72 and electrical connection between the input board 76 and the electronic circuit board 72. Hereinafter, specific examples of electrical connections between these boards will be described with reference to FIGS. 6A and 6B. FIGS. 6A and 6B are cross-sectional views taken along line 6A–6A' and line 6B–6B' in FIG. 5B, respectively.

As shown in FIG. 6A, the input terminal 84 of the driver circuit board 78 and a board terminal 82B for driver circuit board disposed on the electronic circuit board 72 are electrically connected to each other via the anisotropic conductive film 92, and the branch wiring line 90 of the input board 76 and a board terminal 82A for input board disposed on the electronic circuit board 72 are electrically connected to each other via the anisotropic conductive film 92. The board terminals 82A and 82B are electrically connected to each other via a board line 82C. In this way, electrical connection among the input board 76, the driver circuit board 78 and the electronic circuit board 72 is achieved.

The electrical connection among these boards is not limited to the arrangement described above. For example, the branch wiring line 90 and the input terminal 84 can be located close to each other by appropriately determining the shapes of the input board 76 and the driver circuit board 78 and/or the placement of the branch wiring line 90 and the input terminal 84, so that the electrical connection among these boards can be achieved with a single board terminal without the necessity of providing the board line 82C.

As shown in FIG. 6B, the signal line 80 of the electronic circuit board 72 and the output terminal 86 of the driver circuit board 78 are electrically connected to each other via the anisotropic conductive film 92.

Hereinafter, a method for manufacturing the electronic module 70 described above will be described with reference to FIGS. 5A, 5B, 6A and 6B.

The anisotropic conductive film 92 is formed on predetermined areas of the terminal region 74 of the electronic circuit board 72. The input board 76 and the plurality of driver circuit boards 78 are positioned with respect to the electronic circuit board 72 so as to overlap the predetermined areas of the terminal region 74 via the anisotropic conductive film 92, and then bonded to the anisotropic conductive film 92 under compression, simultaneously. A polymer film (for example, a polyimide film) is preferably used as the base of both the input board 76 and the driver circuit boards 78. Therefore, these boards can be bonded to the terminal region 74 simultaneously with no trouble related to the difference in substrate thickness.

By the bonding described above, the input terminals 84 of the driver circuit boards 78 and the branch wiring lines 90 of the input board 76 are electrically connected to each other via the board terminals 82 of the electronic circuit board 72. Also, the output terminals 86 of the driver circuit boards 78 and the signal lines 80 of the electronic circuit board 72 are electrically connected to each other.

In the method for manufacturing the electronic module 70 described above, the input board 76 and the driver circuit boards 78 can be bonded to the anisotropic conductive film 92 simultaneously. This simplifies the manufacturing process and reduces the number of manufacturing steps, compared with the TCP type shown in FIGS. 1A and 1B and the COG types shown in FIGS. 3A, 3B and FIG. 4.

As shown in FIGS. 5A and 5B, the electronic circuit board 72 may have another terminal region 75 extending in the y direction crossing the x direction (typically at about 90°), and a plurality of driver circuit boards 79 may be mounted along a line on the terminal region 75. Like the driver circuit boards 78, the driver circuit boards 79 supply signals to the signal lines 80 on the electronic circuit board 72 via their output terminals 94. The driver circuit boards 79 receive signals from the input board 76 via their input terminals 96, for example. That is, the common input board 76 supplies signals to both the driver circuit boards 78 mounted on the terminal region 74 and the driver circuit boards 79 mounted on the terminal region 75. By using the common input board 76 for supply of signals to the driver circuit boards 78 and 79, only one point is necessary for connection with an external circuit board. This reduces the manufacturing cost and improves the workability of the manufacturing process. Signals may be transferred to the adjacent driver circuit boards 79 via a wiring line disposed on the terminal region 75 of the electronic circuit board 72, for example.

Figure 7:
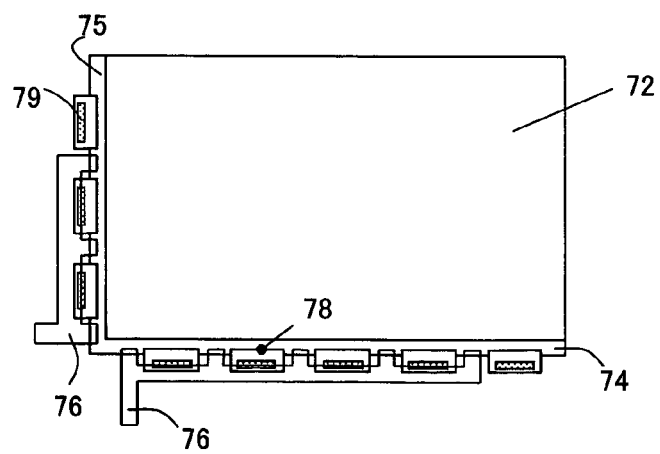
FIG. 7 shows a modification of the electronic module according to a preferred embodiment of the present invention.

In the above description, signals are supplied to the driver circuit boards 78 mounted on the terminal region 74 of the electronic circuit board 72 by use of the input board 76. As a modification, as shown in FIG. 7, signals may be supplied to the driver circuit boards 79 mounted on the terminal region 75 by use of the input board 76. This construction is advantageous in preventing degradation of signals transmitted to the driver circuit boards 79. The electronic module shown in FIG. 7 is disadvantageous in that at least two points are necessary for reception of external signals. However, for large-size electronic equipment, the advantage obtained by this construction outweighs this disadvantage. Also, for large-size electronic equipment, each input board 76 may be divided to form two or more input boards.

By using the electronic module of this preferred embodiment having the unique construction described above, it is possible to provide higher-quality electronic equipment in which degradation of signals is prevented. In particular, a significant effect can be obtained with the unique construction described above when the present invention is applied to a large-size display of 30 inches or more.

In a preferred embodiment of the present invention, the input board 76 includes a belt portion 76A extending in the x direction and a plurality of protrusions 76B extending from the belt portion 76A in the y direction. The main wiring lines run on the belt portion 76A, and the branch wiring lines 90 run on the protrusions 76B. The plurality of driver circuit boards 78 are disposed at positions between every two adjacent protrusions 76B. In other words, the driver circuit boards 78 and the protrusions 76B are arranged alternately.

In a preferred embodiment, the input terminals 84 are disposed on a region of each driver circuit board 78 near one of two edges 78A of the driver circuit board 78 spaced which are spaced apart from each other in the x direction. One driver circuit board 78 corresponds to one protrusion 76B, and receives signals from the branch wiring lines 90 running on the corresponding protrusion 76B.

As will be described later in another preferred embodiment, the input terminals 84 may be disposed on at least two regions of each driver circuit board 78 which are spaced apart from each other in the x direction, for example. In this case, the width of the terminal region can be further reduced.

To further reduce the width of the terminal region 74, the electronic module 70 may be constructed as in the following specific examples.

Figure 8A:
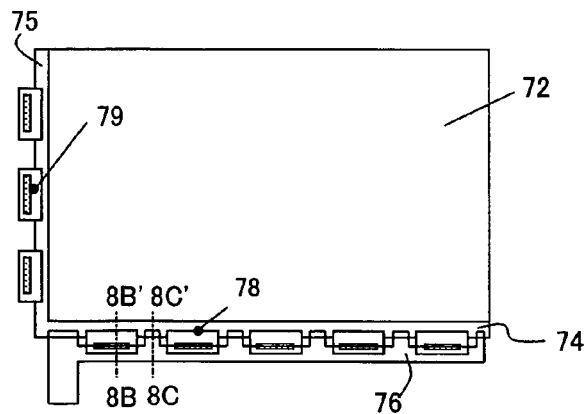
FIG. 8A is a plan view of another modification of the electronic module according to a preferred embodiment of the present invention.
Figure 8B:
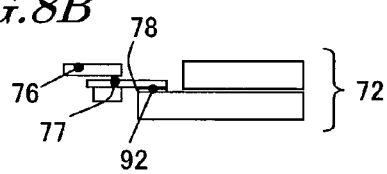
FIGS. 8B and 8C are cross-sectional views taken along line 8B–8B' and line 8C–8C' in FIG. 8A.
Figure 8C:
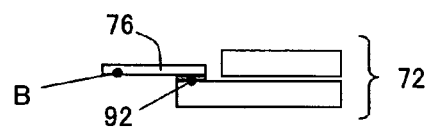

One specific example is shown in FIGS. 8A, 8B and 8C. FIG. 8A is a plan view of an electronic module of this example, and FIGS. 8B and 8C are cross-sectional views taken along line 8B–8B' and line 8C–8C' in FIG. 8A, respectively. In this electronic module, the driver circuit boards 78 are arranged to overlap the belt portion 76 of the input board 76 as is viewed in a direction that is perpendicular to the electronic circuit board 72. By this overlap arrangement between the input board 76 and the driver circuit boards 78, the width of the terminal region can be further reduced.

Figure 9A:
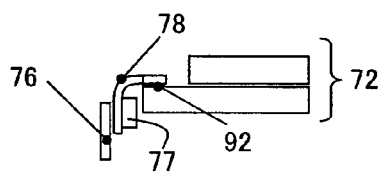
FIGS. 9A and 9B show a yet another modification of the electronic module according to a preferred embodiment of the present invention.
Figure 9B:
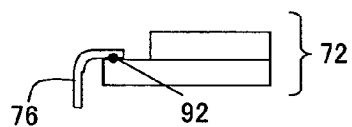

Another specific example is shown in FIGS. 9A and 9B. FIGS. 9A and 9B are cross-sectional views corresponding to line 8B–8B' and line 8C–8C' in FIG. 8A, respectively. In this electronic module, the protrusions 76B of the input board 76 and the driver circuit boards 78 are bent simultaneously to form a predetermined angle with respect to the electronic circuit board 72. The FPC, COF and TCP devices are bendable. Therefore, when a FPC is used for the input board 76 and COFs or TCPs are used for the driver circuit boards 78 as described above, the external size of the electronic module can be reduced by bending the PFC and COFs or TCPs in the manner described above.

In the electronic module 70, signals can be supplied to the plurality of driver circuit boards 78 using the input board 76 having a single substrate. In addition, the input board 76 and the driver circuit boards 78 can be bonded to the electronic circuit board 72 under compression simultaneously. However, with increase of the length (in the x direction) of the input board 76, it will become not possible to align the input board 76 with the electronic circuit board 72 with the same alignment precision over the entire length of the input board 76. To overcome this problem, the pitch of arrangement of the board terminals 82A for the input board on the electronic circuit board 72 may be determined as described below, to thereby secure electrical connection between the input board 76 and the electronic circuit board 72 without complicating the alignment work.

Figure 10:
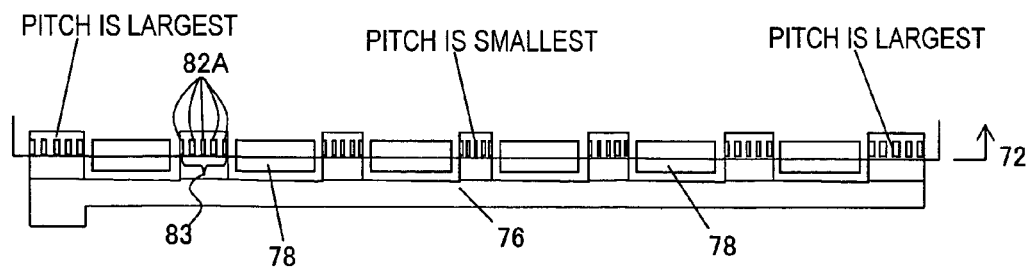
FIG. 10 shows a yet another modification of the electronic module according to a preferred embodiment of the present invention.
Figure 10:
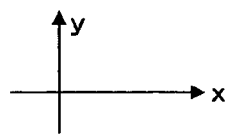

Referring to FIG. 10, assume that a total of m (m≧3, m=6 in FIG. 10) driver circuit boards 78 are to be mounted on the electronic circuit board 72. Also assume that m sets of branch wiring lines 90 corresponding to the m driver circuit boards 78 (for transmitting signals to the m driver circuit boards 78) are provided on the input board 76. Note that in FIG. 10 in which each driver circuit board 78 receives signals from the branch wiring lines located on both sides, the number of protrusions of the input board 76 is m+1.

Assume that the board terminals 82A for the input board on the electronic circuit board 82 form n (n≧3, n=7 in FIG. 10) board terminal groups 83, including the first, second, . . . , k-th, (k+1)th, . . . , n-th groups arranged in the x direction, each including a plurality of board terminals 82A for the input board arranged in the x direction at a predetermined pitch. In this electronic module, the pitch is set for each board terminal group so that the pitch $P_k$ in the k-th board terminal group 83 and the pitch $P_{k+1}$ in the (k+1)th board terminal group 83 have the relationship $P_k < P_{k+1}$. In other words, the pitch in each board terminal group 83 is made larger stepwise as the position of the board terminal group 83 on the terminal region is farther from the center toward both ends of the terminal region (in the x direction). With this unique arrangement, electrical connection between the input board 76 and the electronic circuit board 72 can be reliably ensured.

A specific example of the arrangement shown in FIG. 10 is as follows.

The pitch of the board terminals 82A for the input board in the board terminal group 83 in the center (fourth from the left) is preferably about 0.2 mm, while the pitch of the board terminals 82A for the input board in the board terminal groups 83 in both ends (first and seventh from the left) is preferably about 0.4 mm. The pitch of the board terminals 82A for the input board is made gradually larger from the board terminal group 83 in the center toward ones in both ends (in the order of the fourth, third, second and first from the left, and in the order of the fourth, fifth, sixth and seventh from the left). The average pitch is preferably about 0.3 mm. The pitch of the wiring lines (terminals) on the input board 76 is also set to correspond to the pitch of the board terminals 82A for input board.

In general, the size precision of a FPC is of the order of about 0.1% with respect to its length. When a 300 mm long FPC is used for the input board 76 and alignment is made with the center of the FPC as the reference, the displacement at both ends of the FPC will be about 0.15 mm (=(300 mm/2)×0.1%). By arranging the board terminals 82A as described above, a failure during connection between the input board 76 and the electronic circuit board 72 due to the displacement can be prevented, and thus the yield rate increases.

Figure 11A:
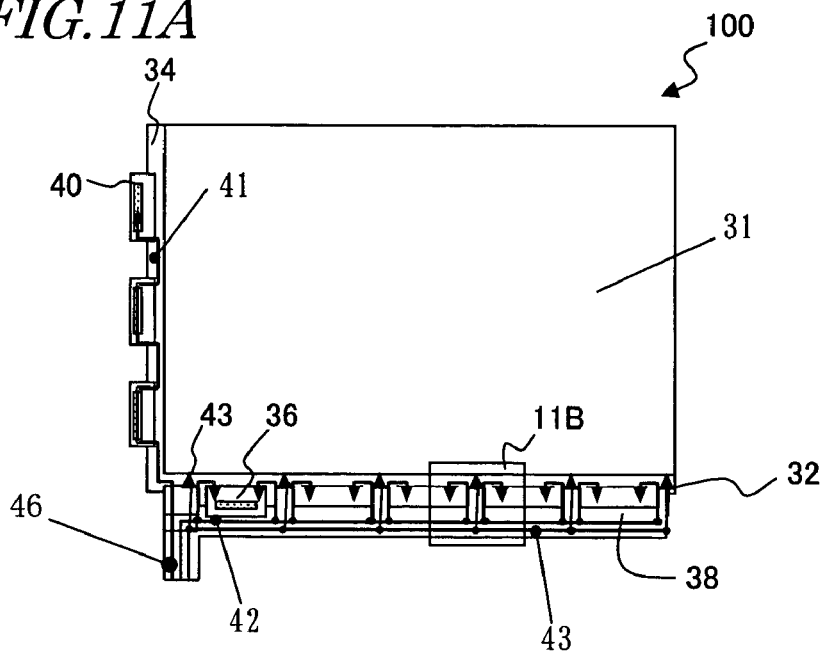
FIG. 11A is a plan view of a liquid crystal module of another preferred embodiment of the present invention.

Next, a liquid crystal module 100 of a preferred embodiment of the present invention will be described with reference to FIGS. 11A and 11B. The electronic circuit board 72 described above corresponds to a display panel 31 of the liquid crystal module 100. The display panel 31 includes TFTs for driving pixels, for example, as the circuit elements, and source lines and gate lines connected to the TFTs as the signal lines 80. The display panel 31 also includes a source terminal region 32 and a gate terminal region 34. On the source terminal region 32, a plurality of source driver circuit boards 36 and an input FPC (input board) 38 are mounted. The source driver circuit boards 36 have drive circuits for supplying signals to the source lines. On the gate terminal region 34, a plurality of gate driver circuit boards 40 are mounted.

The source driver circuit boards 36 and the gate driver circuit boards 40 are preferably COFs. A COF, which permits running of a number of wiring lines on the bottom of a drive circuit (IC chip), is suitably used for applications including a large number of signals (for example, 40 or more) to be transmitted.

Figure 11B:
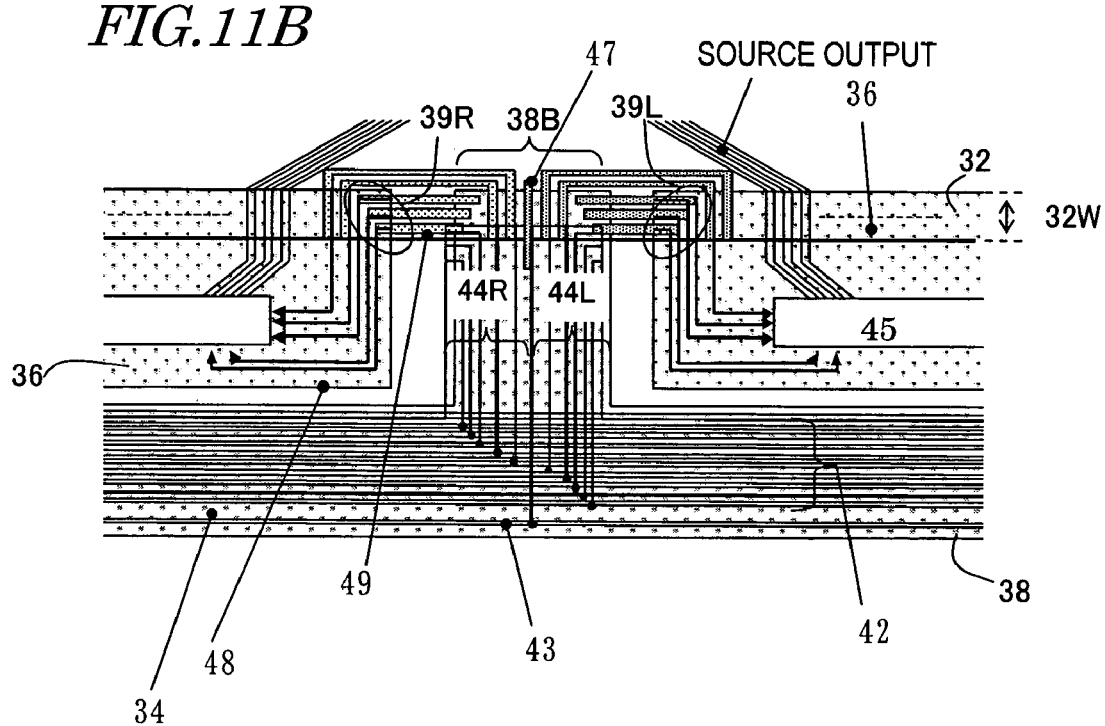
FIG. 11B is a partially enlarged view of region 11B in FIG. 11A.

In this preferred embodiment, as shown in FIG. 11B, input terminals 39 of each source driver circuit board 36 are disposed on two regions of the driver circuit board 36 which are spaced apart from each other in the x direction. In other words, the input terminals 39 are disposed at both edges of each source circuit board 36. Note that although FIG. 11B shows a region including portions of two source driver circuit boards 36, the right edge of the source driver circuit board 36 on the right as is viewed from FIG. 11B is the same in structure as the right edge of the source drive circuit 36 on the left. Among the input terminals 39 of one source driver circuit board 38, input terminals disposed on the left edge of the source driver circuit board 38 are collectively called a first-side input terminal group 39L, and those disposed on the right edge thereof are collectively called a second-side input terminal group 39R.

The input FPC 38 has main wiring lines for supplying source driving signals (source signal and power supply voltage) 42 to the respective source driver circuit boards 36 (the main wiring lines are also denoted by 42), a wiring line for directly supplying a voltage (for example, counter voltage) 43 to the display panel, and branch wiring lines 44 branched from the main wiring lines. The branch wiring lines 44 define a first-side branch wiring line group 44L and a second-side branch wiring line group 44R, branched from the main wiring lines 42 in different regions which are spaced apart from each other in the x direction. The first-side branch wiring line group 44L are electrically connected to the first-side input terminal group 39L, and the second-side branch wiring line group 44R are electrically connected to the second-side input terminal group 39R.

Each protrusion 38B of the input FPC 38 has the second-side branch wiring line group 44R connected to the driver circuit board 36 on the left side and the first-side branch wiring line group 44L connected to the driver circuit board 36 on the right side.

As described above, in the liquid crystal module 100, the input terminals of each driver circuit board 36 are disposed on two regions which are separately to receive signals from the branch wiring lines located on both sides of the driver circuit board 36. Therefore, the number of input terminals disposed on one edge of each driver circuit board 36 can be halved, compared with the case of arranging the input terminals only on one edge of each driver circuit board 36 as in the preferred embodiment shown in FIGS. 5A and 5B. This makes it possible to reduce the width 32W of the terminal region 32, and thus reduce the frame region of the liquid crystal module. Note that if a smaller size of the input FPC 38 is desired, the construction of receiving signals from only one side as shown in FIGS. 5A and 5B is preferred.

Hereinafter, the liquid crystal module 100 of this preferred embodiment will be described in more detail.

In the liquid crystal module 100, gate driving signals (gate signal and power supply voltage) 41, the source driving signals (source signal and power supply voltage) 42 and the voltage 43 directly supplied to the display panel are supplied via input terminals 46 of the input FPC 38. In other words, the liquid crystal module 100 receives all signals via one point of the common input FPC 38.

The gate driving signals 41 input via the FPC input terminal 46 are transmitted to the gate driver circuit boards 40 through a panel wiring line disposed on the display panel 31. Although not shown in detail in FIG. 11A, signal/power supply wiring lines of the gate driver circuit boards 40 are arranged in a cascade connection via the panel wiring line. Details are described in Japanese Laid-Open Patent Publication No. 2001-188246, for example.

The voltage (for example, counter voltage) 43 directly supplied to the display panel 31, input via the FPC input terminal 46, is supplied to a counter electrode 47 on the display panel 32 through the wiring line disposed on the input FPC 38.

In the liquid crystal module 100, the source driver circuit boards 36 and the input FPC 38 may overlap each other, as shown in FIGS. 8A to 8C. In this case, the external size of the module can be further reduced. If no limitation is imposed on the size, this overlapping is unnecessary.

The external size of the liquid crystal module can also be further reduced by bending the driver circuit boards 36 and the input FPC 38, as shown in FIGS. 9A and 9B. The driver circuit boards 36 and the input FPC 38, preferably made of a flexible material having a thickness of the base of for example, about 40 µm or less, can be bent at an arbitrary position.

Hereinafter, the respective components of the liquid crystal module 100 of this preferred embodiment will be described in detail.

The display panel 31 includes two substrates and a liquid crystal layer interposed therebetween.

One of the substrates (TFT substrate) includes a base plate, and source bus lines (source lines), gate bus lines (gate lines), TFTs and pixel electrodes disposed on the base plate. The TFTs are located at positions near the crossings of the source lines and the gate lines. The pixel electrodes are connected to the source lines and the gate lines via the TFTs. The base plate is preferably made of aluminoborosilicate glass having a size of, for example, approximately 315 mm long×237 mm wide and a thickness of about 0.7 mm. The source lines and the gate lines are preferably formed of an Al thin film. The pixel electrodes are preferably formed of a transparent conductive film such as an indium tin oxide (ITO) film.

The other substrate (color filter substrate) preferably includes a base plate and a color filter layer and the counter electrode disposed on the base plate. The base plate is preferably made of aluminoborosilicate glass having a size of, for example, approximately 313 mm. long×235 mm wide and a thickness of about 0.7 mm. The color filter is preferably made of a pigment dispersion type acrylic resin. The counter electrode is preferably formed of a transparent conductive film such as an ITO film.

The TFT substrate and the color filter substrate are bonded together with a sealing agent, and the liquid crystal layer is interposed between the two substrates as a display medium layer that changes its display-related state depending on the voltage.

The source driver circuit boards 36 and the gate driver circuit boards 40 are preferably COFs, each of which is preferably formed of a polyimide base having a size of approximately 28 mm long×6.5 mm wide and a thickness of about 40 µm. An approximately 12 µm thick Cu pattern is formed on the base, and an IC 45 having a size of, for size of, for example, approximately 18 mm long×1.5 mm wide is formed on the Cu pattern. The Cu pattern is sealed with a solder resist excluding the portion in connection with the display panel 31. The IC 45 is surrounded with resin coating.

The input FPC 38 is preferably formed of a polyimide base having a size of, for example, approximately 300 mm long×50 mm wide and a thickness of about 25 µm. An approximately 18 µm thick Cu pattern is formed on each of the opposite sides of the base, and the Cu patterns on these sides are connected to each other via a through hole. The Cu patterns are protected with a coverlay excluding the portions in connection with the display panel 31 and an external circuit board.

Figure 4:
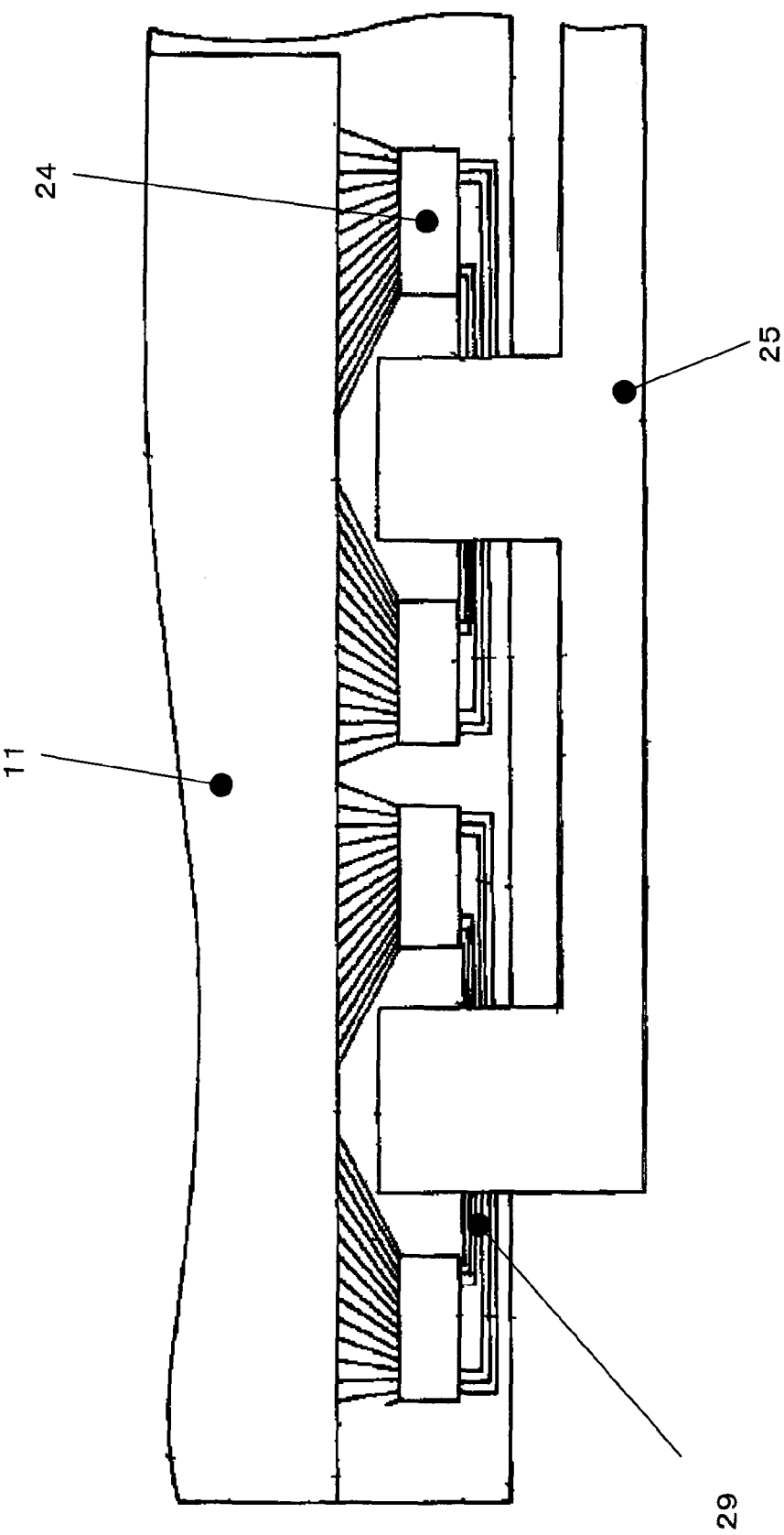
FIG. 4 is a diagrammatic view showing a structure of another conventional COG type liquid crystal module.
Figure 12A:
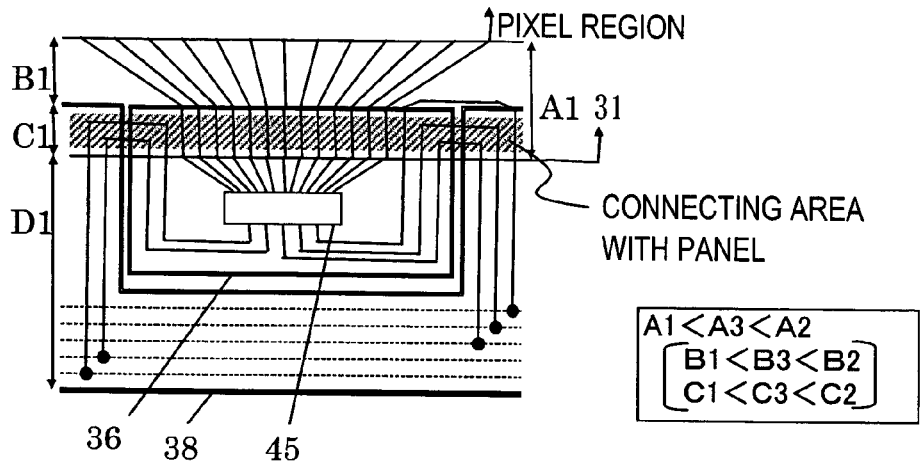
FIGS. 12A, 12B and 12C are views of the liquid crystal module of a preferred embodiment of the present invention, the COG type liquid crystal module and the substrate-free type liquid crystal module, respectively, shown for comparison of the width of a source terminal region.

Hereinafter, the width of the source terminal region 32 of the liquid crystal module 100 of this preferred embodiment is compared with those of the conventional liquid crystal modules with reference to FIGS. 12A to 12C. FIG. 12A shows the liquid crystal module 100, FIG. 12B shows the COG type liquid crystal module shown in FIG. 4, and FIG. 12C shows the substrate-free type liquid crystal module shown in FIG. 2.

Figure 12B:
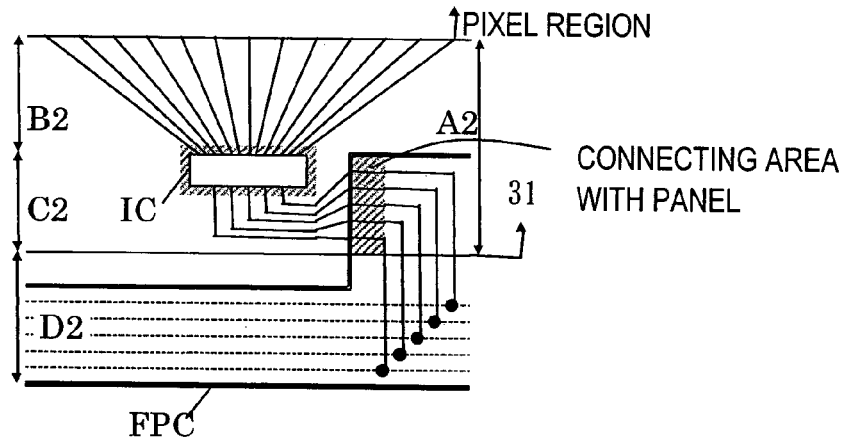
Figure 12C:
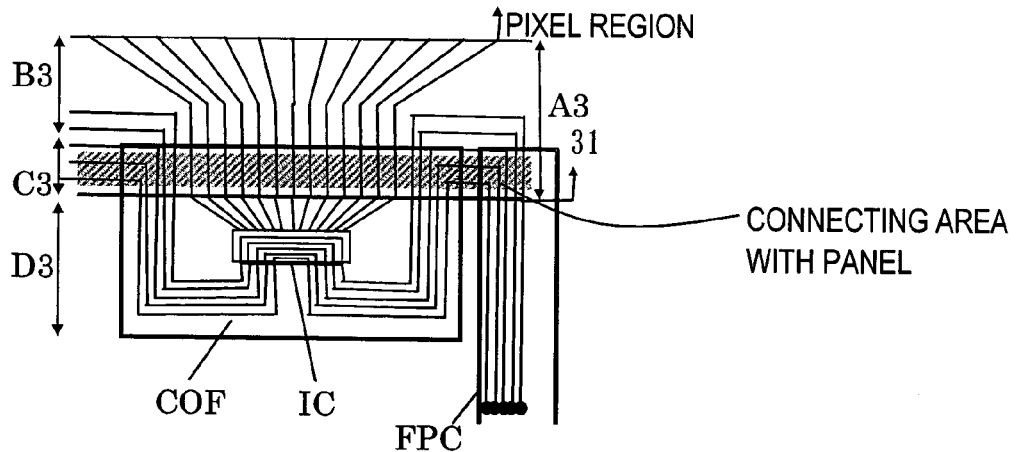

As is seen from FIGS. 12A to 12C, the width A1 of the source terminal region of the liquid crystal module 100 of this preferred embodiment is smaller than the width A2 in the COG type and the width A3 in the substrate-free type, where A1<A3<A2.

That is, in the liquid crystal module 100 of this preferred embodiment, both the wiring area B in the source terminal region 32 of the display panel 31 and the connecting area C required for connection between the source driver circuit boards 36/input FPC 38 and the display panel 31 can be made smaller than those in the other types of liquid crystal modules, where B1<B3<B2 and C1<C3<C2. Note that the area D does not directly influence the size of the display unit because this area can be reduced by bending the source driver circuit boards 36 and the input FPC 38.

Hereinafter, a method for manufacturing the liquid crystal module 100 will be described.

First, an anisotropic conductive film (ACF) is formed on predetermined areas of the gate terminal region 34 and the source terminal region 32 of the display panel 31.

The source driver circuit boards 36 and the gate driver circuit boards 40 are positioned on the display panel 31 via the ACFs by aligning the input and output terminals of the source driver circuit boards 36 and the gate driver circuit boards 40 with display panel terminals 49 of the display panel 31. The pitch of the output terminals of the source driver circuit boards 36 and the gate driver circuit boards 40 is preferably about 60 µm, and the pitch of the input terminals thereof is preferably about 300 µm.

The input FPC 38 is then positioned on the display panel 31 via the ACFs by aligning the terminals of the input FPC 38 with display panel terminals 49 of the display panel 31.

As in the driver circuit boards described above, the pitch of the terminals of the input FPC 38 is preferably about 300 μm.

Thereafter, the gate driver circuit boards 40, the source driver circuit boards 36 and the input FPC 38 are bonded to the display panel 32 at about 200° C. using a linear thermocompression bonding tool. The connection between the source driver circuit boards 36 and the display panel 31 and the connection between the input FPC 38 and the display panel 31 are performed simultaneously. In this way, the liquid crystal module of this preferred embodiment is produced.

The manufacturing method described above is simple in process, has a small number of manufacturing steps and is high in throughput, compared with the manufacturing methods for the TCP type module and the COG type module.

Figure 1A:
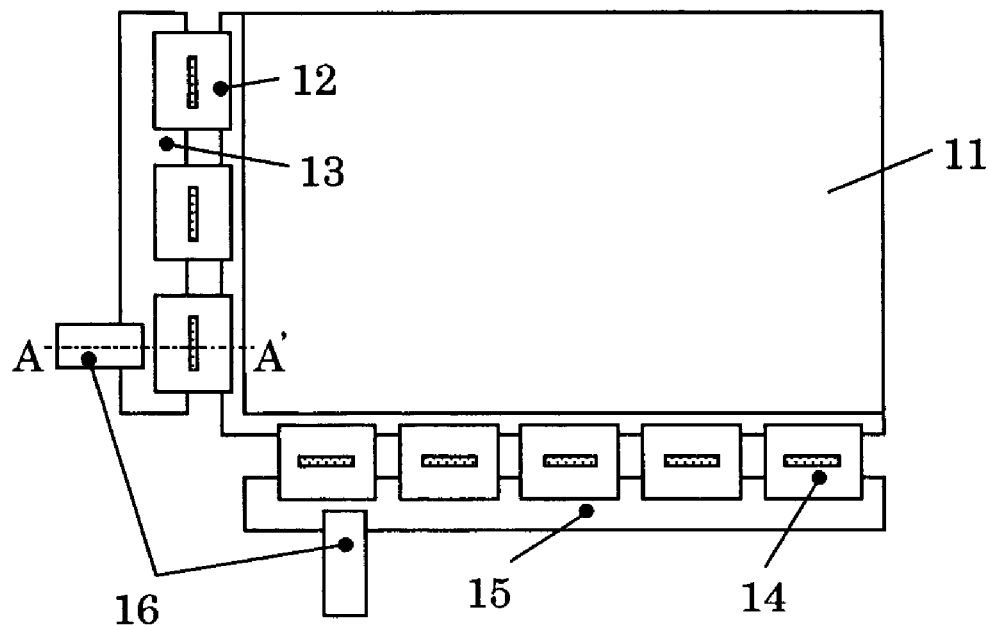
FIG. 1A is a diagrammatic view showing a structure of a conventional TCP type liquid crystal module.
Figure 1B:
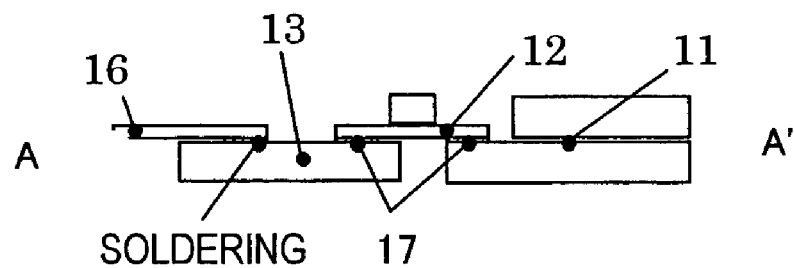
FIG. 1B is a cross-sectional view taken along line A–A' in FIG. 1A.
Figure 3A:
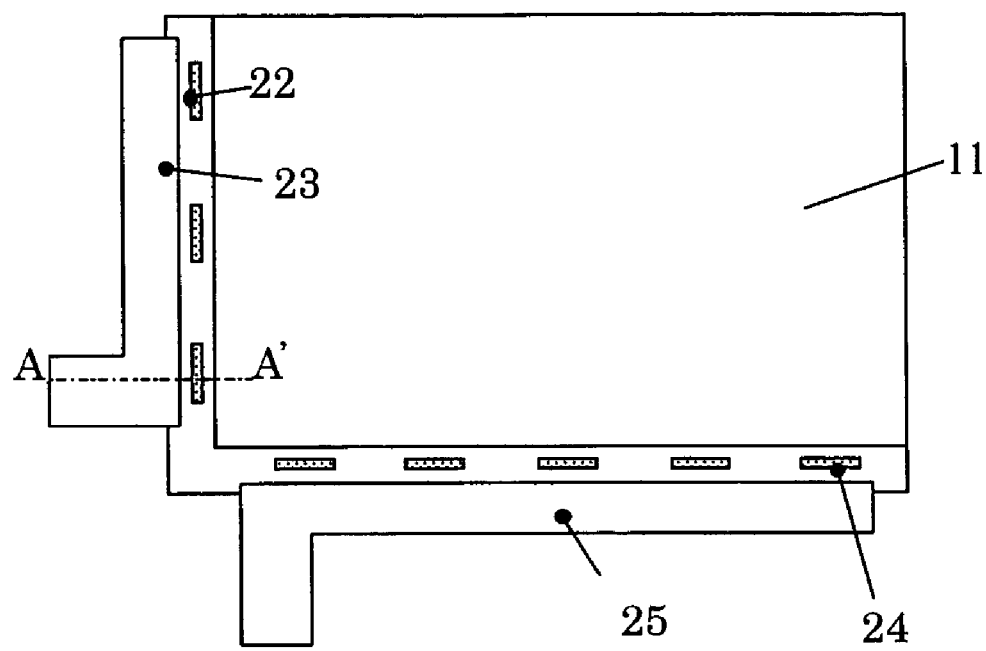
FIG. 3A is a diagrammatic view showing a structure of a conventional COG type liquid crystal module.
Figure 3B:
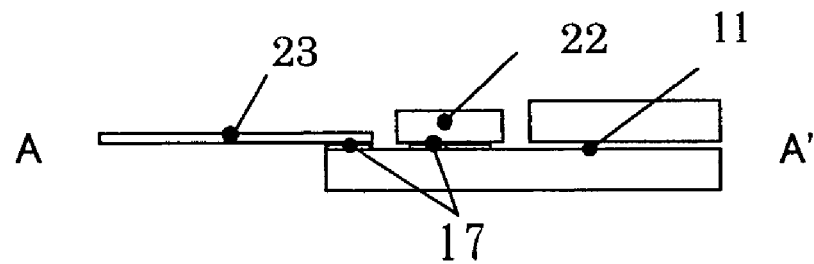
FIG. 3B is a cross-sectional view taken along line A–A' in FIG. 3A.
Figure 13:
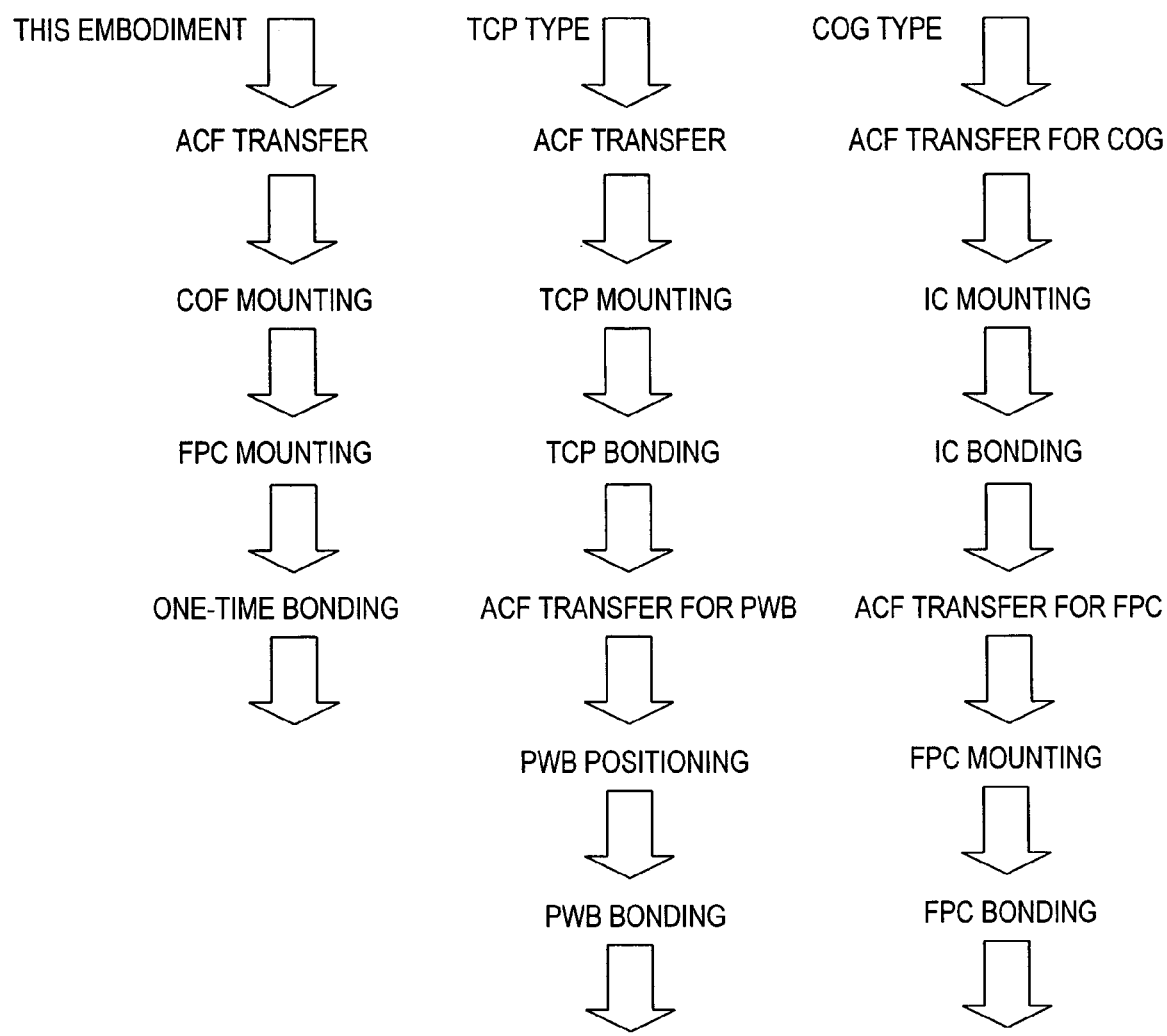
FIG. 13 shows flowcharts of manufacturing processes for the liquid crystal module of a preferred embodiment of the present invention, the TCP type liquid crystal module and the COG type liquid crystal module, for comparison.

The method for manufacturing the liquid crystal module 100 of this preferred embodiment is compared with the manufacturing methods for the TCP type module shown in FIGS. 1A and 1B and the COG type modules shown in FIGS. 3A and 3B and FIG. 4. FIG. 13 shows flowcharts of steps of the respective manufacturing methods.

As is seen from FIG. 13, the TCP type and the COG type involve two bonding steps. That is, in the TCP type, TCP bonding and PWB bonding are performed separately. In the COG type, driver IC bonding and FPC bonding are performed separately because the driver ICs and the input FPC are different in height.

Contrarily, in the manufacturing method of this preferred embodiment, the input FPC and the driver circuit boards can be bonded simultaneously, and thus, the number of manufacturing steps can be reduced to two-thirds compared with the TCP type and the COG type. This enables reduction of the manufacturing (mounting) cost compared with the conventional methods.

The results of the comparison of the liquid crystal module of this preferred embodiment with the conventional TCP type (FIGS. 1A and 1B), substrate-free type (FIG. 2) and COG types (FIGS. 3A and 3B and FIG. 4) are shown in Table 1 below. As shown in Table 1, the liquid crystal module of this preferred embodiment was determined to be very good in all of the items examined.

| | | Present invention | TCP type FIGS. 1A/B | Substrate-less type FIG. 2 | COG type (1) FIGS. 3A/B | COG type (2) FIG. 4 |
|---|---|---|---|---|---|---|
| Cost | Parts | ○ | X | ○ | ○ | ○ |
| | Display panel | ○ | ○ | Δ | X | Δ |
| | Mounting | ○ | X | ○ | Δ | X |
| Applicability | Large size | ○ | ○ | X | ○ | ○ |
| | High definition | ○ | ○ | Δ | ○ | ○ |
| | Narrow frame | ○ | ○ | ○ | X | Δ |
| Assembly workability | | ○ | X | ○ | ○ | ○ |
| Connection with external circuit board | | ○ | Δ | Δ | Δ | Δ |

Thus, according to various preferred embodiments of the present invention, an electronic module that has a very small frame width and is applicable to all types of electronic equipment is provided. In addition, a method for manufacturing an electronic module that requires no complicated manufacturing process and is low in manufacturing cost is provided.

The present invention is very suitable for high-definition, large-size equipment and applicable to all types of electronic equipment for all uses, including TV sets, notebook personal computers and monitors.

While the present invention has been described with respect to preferred embodiments, it will be apparent to those skilled in the art that the disclosed invention may be modified in numerous ways and may assume many embodiments other than that specifically set out and described above. Accordingly, it is intended by the appended claims to cover all modifications of the present invention that fall within the true spirit and scope of the invention.

What is claimed is:

1. An electronic module comprising:
   an electronic circuit board having a plurality of circuit elements, a plurality of signal lines connected to the plurality of circuit elements, and a plurality of board terminals disposed on a terminal region; and
   an input board, a first driver circuit board and a second driver circuit board mounted on the terminal region of the electronic circuit board; wherein
   each of the first and second driver circuit boards has a plurality of input terminals and a plurality of output terminals, the plurality of output terminals being electrically connected to the plurality of signal lines of the electronic circuit board;
   the input board has a plurality of main wiring lines for transmitting signals input externally, and a plurality of first branch wiring lines and a plurality of second branch wiring lines branched from the plurality of main wiring lines; and
   the plurality of first branch wiring lines and the plurality of second branch wiring lines are electrically connected to the plurality of input terminals of the first driver circuit board and the plurality of input terminals of the second driver circuit board, respectively, via the plurality of board terminals of the electronic circuit board.

2. The electronic module of claim 1, wherein the terminal region includes an x terminal region arranged along an x direction of the electronic circuit board, and the first and second driver circuit boards are mounted on the x terminal region so as to be adjacent to each other along the x direction.

3. The electronic module of claim 1, wherein the terminal region includes an x terminal region arranged along an x direction of the electronic circuit board, and the input board has a belt portion extending in the x direction and a plurality of protrusions extending in a y direction crossing the x direction from the belt portion.

4. The electronic module of claim 3, wherein each of the first and second driver circuit boards is placed between a pair of the protrusions which are adjacent to each other, and the plurality of first and second branch wiring lines extend along the plurality of protrusions.

5. The electronic module of claim 4, wherein the plurality of input terminals of each of the first and second driver circuit boards define first-side and second-side input terminal groups located on at least two regions which are spaced apart from each other in the x direction, and the plurality of first branch wiring lines and the plurality of second branch wiring lines individually define first-side and second-side branch wiring line groups branched from the main wiring lines in different regions which are spaced apart from each other in the x direction in correspondence with the first-side and second-side input terminal groups.

6. The electronic module of claim 2, wherein the plurality of input terminals of each of the first and second driver circuit boards define first-side and second-side input terminal groups located on at least two regions which are spaced apart from each other in the x direction.

7. The electronic module of claim 6, wherein the plurality of first branch wiring lines and the plurality of second branch wiring lines individually define first-side and second-side branch wiring line groups branched from the main wiring lines in different regions which are spaced apart from each other in the x direction in correspondence with the first-side and second-side input terminal groups.

8. The electronic module of claim 7, wherein the input board has a belt portion extending in the x direction and a plurality of protrusions extending in a y direction crossing the x direction from the belt portion, and the plurality of protrusions include a protrusion having the second-side branch wiring line group connected to the first driver circuit board and the first-side branch wiring line group connected to the second driver circuit board.

9. The electronic module of claim 4, wherein each of the first and second driver circuit boards has first and second edges spaced apart from each other in the x direction, the plurality of input terminals of the first driver circuit board are located near the first edge of the first driver circuit board, and the plurality of input terminals of the second driver circuit board are located near the first edge of the second driver circuit board.

10. The electronic module of claim 9, wherein the plurality of protrusions include first and second protrusions adjacent to each other in the x direction, the first protrusion has the first branch wiring line, and the second protrusion has the second branch wiring line.

11. The electronic module of claim 3, wherein the first and second driver circuit boards and the belt portion of the input board partially overlap each other when viewed in a direction that is substantially perpendicular to the electronic circuit board.

12. The electronic module of claim 3, wherein the first and second protrusions of the input board, the first driver circuit board and the second driver circuit board are bent to form a predetermined angle with respect to the electronic circuit board.

13. The electronic module of claim 1, wherein the electronic module includes m (m≧3) driver circuit boards including the first and second driver circuit boards, the input board has m sets of a plurality of branch wiring lines including the plurality of first branch wiring lines and the plurality of second wiring lines respectively corresponding to the m driver circuit boards, the plurality of board terminals of the electronic circuit board include a plurality of board terminals for the input board respectively connected to the m sets of the plurality of branch wiring lines, the plurality of board terminals for the input board on the electronic circuit board form n (n≧3) board terminal groups including the first, second, . . . , k-th, (k+1)th, . . . , n-th groups, each of the n board terminal groups including a plurality of board terminals for input board arranged in an x direction at a predetermined pitch, and in at least two board terminal groups, a predetermined pitch $P_k$ in the k-th board terminal group and a predetermined pitch $P_{k+1}$ in the (k+1)th board terminal group have the relationship $P_k < P_{k+1}$.

14. The electronic module of claim 2, further comprising third and fourth driver circuit boards mounted on a y terminal region of the electronic circuit board arranged along a y direction crossing an x direction, each of the third and fourth driver circuit boards has a plurality of input terminals and a plurality of output terminals, the plurality of output terminals being electrically connected to the plurality of signal lines of the electronic circuit board, the plurality of input terminals receiving signals via the input board.

15. The electronic module of claim 1, wherein the input board is a FPC.

16. The electronic module of claim 1, wherein the first and second driver circuit boards are COFs.

17. The electronic module of claim 1, wherein the input board and the first and second driver circuit boards are bendable.

18. The electronic module of claim 1, wherein the electronic module is a liquid crystal module.

* * * * *